United States Patent
Hu et al.

(10) Patent No.: US 8,828,843 B2
(45) Date of Patent: Sep. 9, 2014

(54) METHOD OF MANUFACTURING ISOLATION STRUCTURE

(71) Applicant: Inotera Memories, Inc., Taoyuan County (TW)

(72) Inventors: Yaw-Wen Hu, Taoyuan County (TW); Jung-Chang Hsieh, New Taipei (TW); Kuen-Shin Huang, New Taipei (TW); Jian-Wei Chen, Keelung (TW); Ming-Tai Chien, New Taipei (TW)

(73) Assignee: Inotera Memories, Inc., Taoyuan County (TW)

( * ) Notice: Subject to any disclaimer, the term of this patent is extended or adjusted under 35 U.S.C. 154(b) by 25 days.

(21) Appl. No.: 13/875,442

(22) Filed: May 2, 2013

(65) Prior Publication Data
US 2014/0220762 A1    Aug. 7, 2014

(30) Foreign Application Priority Data
Feb. 6, 2013   (TW) .............................. 102104579 A

(51) Int. Cl.
*H01L 21/4763*    (2006.01)
*H01L 21/762*     (2006.01)

(52) U.S. Cl.
CPC ............................... *H01L 21/76224* (2013.01)
USPC ........... 438/435; 438/422; 438/624; 438/196; 438/207; 438/208; 438/219; 438/220; 438/221; 438/248; 438/294

(58) Field of Classification Search
USPC ......... 438/435, 422, 624, 196, 207, 208, 218, 438/219, 220, 221, 248, 294, 295, 296, 318, 438/319, 353, 255, 356, 359, 391, 404, 411, 438/412, 414
See application file for complete search history.

(56) References Cited

U.S. PATENT DOCUMENTS

| | | | |
|---|---|---|---|
| 6,800,546 B2 | 10/2004 | Konishi et al. | 438/623 |
| 7,763,523 B2 | 7/2010 | Ahn et al. | 438/425 |
| 2011/0151677 A1 | 6/2011 | Wang et al. | 438/773 |
| 2011/0260288 A1 | 10/2011 | Sukekawa et al. | 257/532 |
| 2013/0146968 A1 | 6/2013 | Kim | 257/330 |

*Primary Examiner* — Zandra Smith
*Assistant Examiner* — Damian A Hillman
(74) *Attorney, Agent, or Firm* — Rosenberg, Klein & Lee

(57) ABSTRACT

A method of manufacturing an isolation structure includes forming a laminate structure on a substrate. A plurality of trenches is formed in the laminate structure. Subsequently a pre-processing is effected to form a hydrophilic thin film having oxygen ions on the inner wall of the trenches. Spin-on-dielectric (SOD) materials are filled into the trenches. The hydrophilic think film having oxygen ions changes the surface tension of the inner wall of the trenches and increases SOD material fluidity.

8 Claims, 5 Drawing Sheets

METHOD OF MANUFACTURING ISOLATION STRUCTURE

BACKGROUND

1. Field of the Invention

The instant disclosure relates to a method of manufacturing a semiconductor integrated circuit; in particular, to a method of manufacturing a high aspect ratio isolation structure without voids or seams.

2. Description of Related Art

In semiconductor manufacturing, being more integrated and highly dense are the trend. For satisfying the desired integration and density, the component scale on the semiconductor wafer are reduced to deep submicron and further shrinking is expected. The shrinking components on the wafer lead to ever minimizing layout. For example, the width and interval of the crosslinked wires, the interval and diameter of contact cavity and surface geometric layout are all affected. Typically, reducing the size of the insulation region between the components on the wafer also contributes to device miniaturization.

Currently local oxidation of silicon (LOCOS) and shallow trench isolation (STI) are conventional processing to form a suitable isolation structure between the components on the wafer. STI processing is more popular because the resulting isolation region is smaller and the substrate remains even after processing.

In the conventional STI processing, silicon dioxide and the other insulation materials fill the shallow trench by high density plasma chemical vapor deposition (HDP-CVD), chemical vapor deposition (CVD) or atomic layer deposition (ALD). Following the reduced scale, the aspect ratio of the to-be-filled shallow trench is higher. The abovementioned processing may fail to accomplish filling under such small scale. This issue is addressed by using spin-on-dielectric (SOD), also known as spin-on glass (SOG), to precipitate SOD materials in the high aspect ratio shallow trench.

However, the conventional processing for filling SOD materials to in the shallow trench does not provide full solution to the problems faced in this arena.

When the aspect ratio of the shallow trench increases, the insulating materials filled by HDP-CVD processing easily result in void formation. The voids is formed due to poor step coverage and the yield rate is reduced accordingly.

Please refer to FIG. 1 showing a conventional isolation structure 1'. The inner wall of a shallow trench 10' is hydrophobic. When hydrophilic SOD materials 20' are filled by the SOD processing to the shallow trench 10', the high surface tension of the inner wall of the shallow trench 10' easily causes low fluidity of the SOD materials 20'. As a result, voids are formed in the shallow trench 10' and affect the yield rate.

In general, the density of silicon dioxide formed by the SOD materials is lower and therefore the subsequent processing for example, dry etching or wet etching, has higher etching rate. In addition, the conversion of SOD materials requires water vapor dispersion therein. The poor dispersion rate is one of the reasons for low density. Hence, in the subsequent hydrofluoric acid washing, SOD materials are prone to erosion and yield rate decreases.

To increase semiconductor component yield rate, the inventor strives via associated experience and research including experimental evidences and evaluation. The instant disclosure, which can effectively improve the limitation described above, is provided.

SUMMARY OF THE INVENTION

The object of the instant disclosure is to manufacture a high-aspect-ratio isolation structure, which is implemented among components on a wafer and does not have voids or seams. A method of manufacturing the isolation structure includes the following steps.

Firstly, laminates are formed on a substrate. Then a plurality of trenches is formed in the laminates. Subsequently, a pre-processing procedure is conducted to form a hydrophilic thin film including oxygen ions on the inner wall of the trench. Finally, SOD materials are filled in the trench. The hydrophilic thin film including oxygen ions changes the surface tension of the inner wall and therefore increases the fluidity of the SOD materials.

In short, in the instant disclosure, the hydrophilic thin film including oxygen ions is formed firstly, therefore reducing surface tension of the inner wall of the trench. As a result, in the SOD processing, the SOD materials easily flow into the trench, thus greatly preventing void formation. Furthermore, after SOD materials convert to silicon dioxide, the oxygen ions enhance the surface consistency or hardness. The increased consistency prevents silicon oxide layer erosion when washed by hydrofluoric acid.

In order to further understand the instant disclosure, the following embodiments are provided along with illustrations to facilitate the appreciation of the instant disclosure; however, the appended drawings are merely provided for reference and illustration, without any intention to be used for limiting the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1:
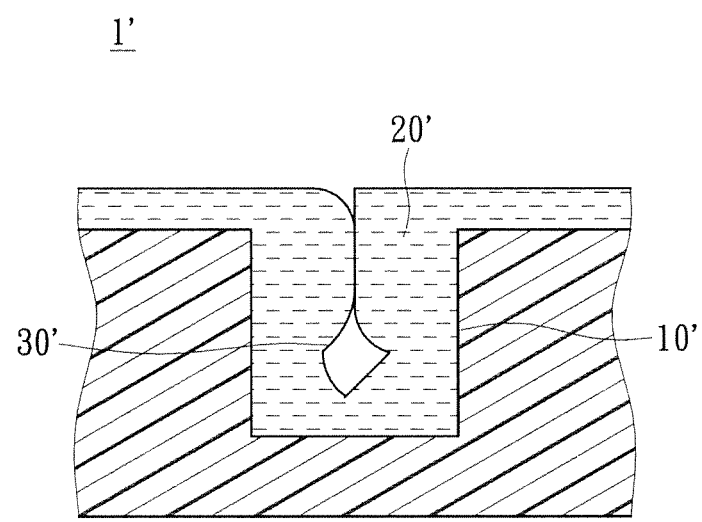
FIG. 1 is a schematic diagram showing conventional isolation structure.
Figure 2:
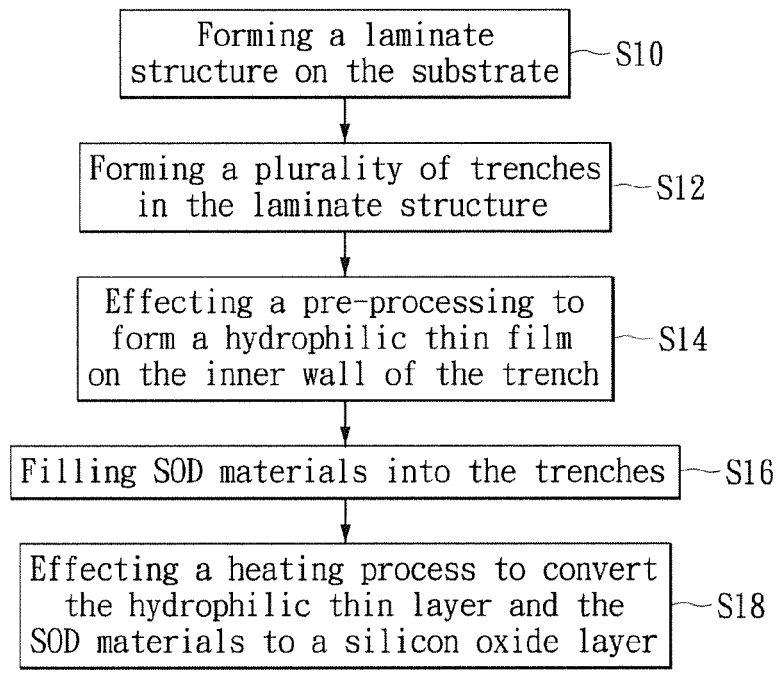
FIG. 2 is a flow chart of a method of manufacturing isolation structure in accordance with the instant disclosure.

Please refer to FIG. 2 showing a flow chart of a method of manufacturing an insulating structure in accordance with the instant disclosure. The method of manufacturing the insulating structure is implemented in semiconductor component fabrication, for example, the isolation structure between two adjacent tungsten contact plugs. The method includes steps S10, forming a laminate structure on a substrate; S12, forming a plurality of trenches in the laminate structure; S14, effecting a pre-processing procedure to form a hydrophilic thin film on the inner wall of the trenches; S16, filling SOD materials in the trenches; and S18, effecting a curing procedure to convert the hydrophilic think film including oxygen ions and the SOD materials to a silicon dioxide layer. The detail of each step is described hereafter.

Figure 3:
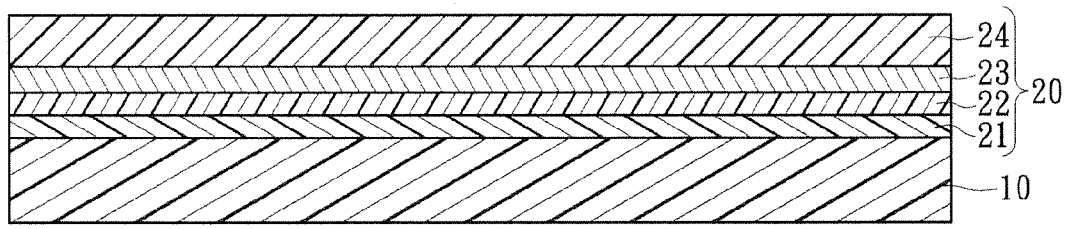
FIG. 3 is a schematic diagram showing step S10 of a method of manufacturing isolation structure in accordance with the instant disclosure.

Referring to FIG. 3, Step S10 provides a substrate 10. Specifically, the substrate 10 can be a silicon wafer or a silicon coated insulating substrate. The laminate structure 20 is formed on the substrate 10. The laminate structure 20 is formed by the following layers in succession, including an oxide layer 21, a silicon rich layer 22, a tungsten layer 23 and a silicon nitride layer 24. Conventional methods known to those skilled in the art may be employed to form each layer of the laminate structure 20 and description thereof is omitted herein. Each layer of the laminate structure 20 may be adjusted to satisfy intended fabrication purpose and the instant disclosure is not limited thereto. For example, in capacitor fabrication, the laminate structure 20 includes a release layer (not shown in figure), which has one or more silicon oxide molecules, formed on the substrate 10. Also, a supporting layer (not shown in figure) made of silicon nitride is formed on the silicon oxides over the release layer.

Figure 4:
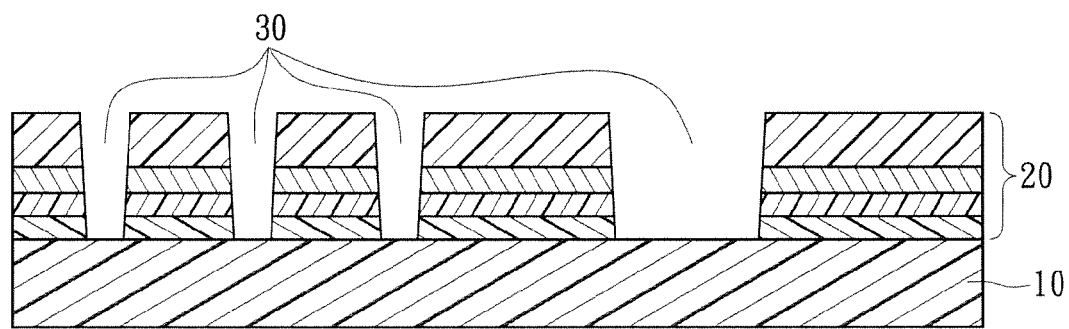
FIG. 4 is a schematic diagram showing step S12 of a method of manufacturing isolation structure in accordance with the instant disclosure.

Referring to FIG. 4, Step S12: forming the plurality of trenches 30 in the laminate structure 20. Specifically, the formation of the trenches 30 includes a silicon oxide pad layer (not shown) on the laminate structure 20. Subsequently, a silicon nitride hard cover layer (not shown) is formed on the pad layer. Then the hard cover layer and pad layer are patterned. The patterned hard cover and pad layers are used as a mask in the etching of laminate layer 20. In another embodiment, the formation of trenches 30 includes the formation of a patterned photoresistant layer (not shown) on the laminate structure 20. Then the patterned photoresistant layer acts as the mask in the etching of laminate layer 20.

Figure 5:
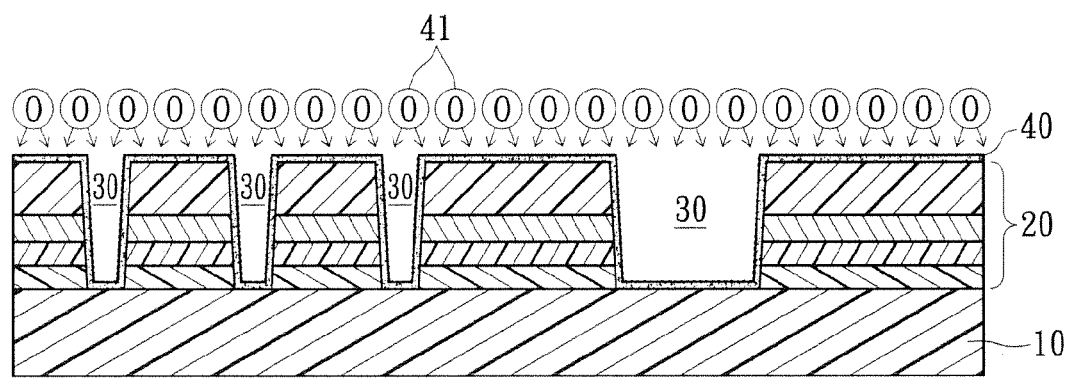
FIG. 5 is a schematic diagram showing step S14 of a method of manufacturing isolation structure in accordance with the instant disclosure.

Referring to FIG. 5, Step S14: effecting a pre-processing procedure to form the hydrophilic thin film 40 including oxygen ions 41 on the inner wall of the trenches 30. In the instant embodiment, the pre-processing procedure includes pumping 15000 SCCM (standard cubic centimeter per minute) ozone to a vacuumed chamber and accelerating the electrons in the plasma to collide with ozone molecules and produce oxygen ions 41. More specifically, the pre-processing is performed at about 470° C. to 490° C., preferably at 480° C. for 30 to 50 seconds. It is worth noting, in the reaction, the oxygen ions 41 attach to the inner wall of the trenches 30 and form the hydrophilic thin film 40, leading to decreased surface tension.

Specifically, the pre-processing procedure can be performed in vacuum, subatmosphere, atmosphere or pressured condition by using high radio frequency (RF) power, ultra violet or heating to produce oxygen ions from gas containing oxygen.

Figure 6:
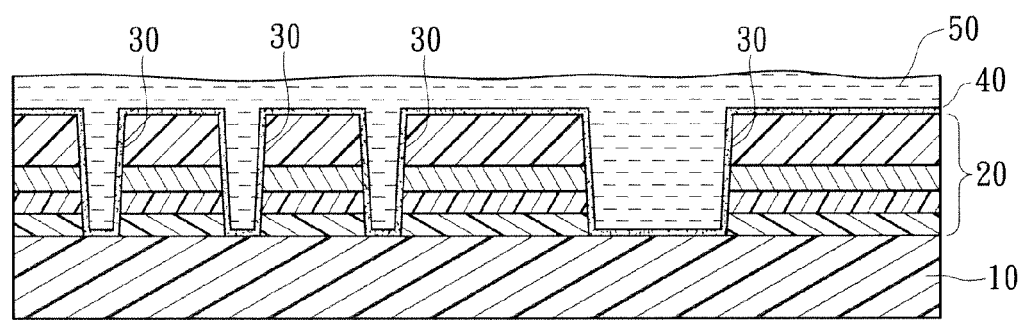
FIG. 6 is a schematic diagram showing step S16 of a method of manufacturing isolation structure in accordance with the instant disclosure.

Referring to FIG. 6, Step S16: filling SOD materials 50 in the trenches 30. Specifically, the SOD materials may be a polysilazane solvent. The polysilazane solvent is selected from the group consisting of xylene, anisole, naphthalene, cyclohexane, methylcyclohexane, ethylcyclohexane, limonene, hexane, octane, nonane, decane, C8-C11 alkane composition, C8-C11 aromatic hydrocarbon composition, aliphatic/cycloaliphatic hydrocarbon composition having 5 to 25 wt % C8 or above aromatic hydrocarbons, and the combination thereof. The solvent contains less fewer than 50 of particles larger than 0.5 μm. Preferably, the SOD material 50 is perhydro-silazane.

Furthermore, the surface tension of the inner wall of the trenches 30 is reduced because the inner wall is covered by the hydrophilic thin film 40 having oxygen ions 41. In other words, the thin film 40 changes the inner wall of the trenches 30 from hydrophobic to hydrophilic. Hence, in SOD processing, the liquid SOD material 50 can easily flow into the trenches 30 and avoid void formation.

Figure 7:
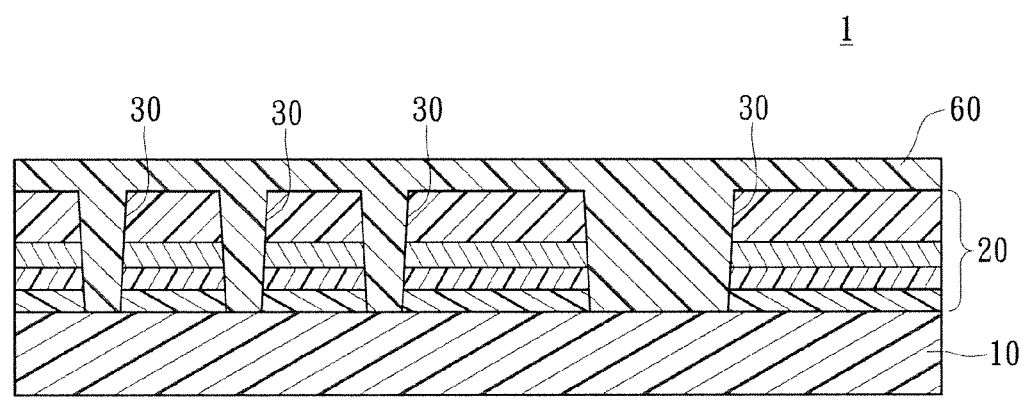
FIG. 7 is a schematic diagram showing step S18 of a method of manufacturing isolation structure in accordance with the instant disclosure.
Figure 8:
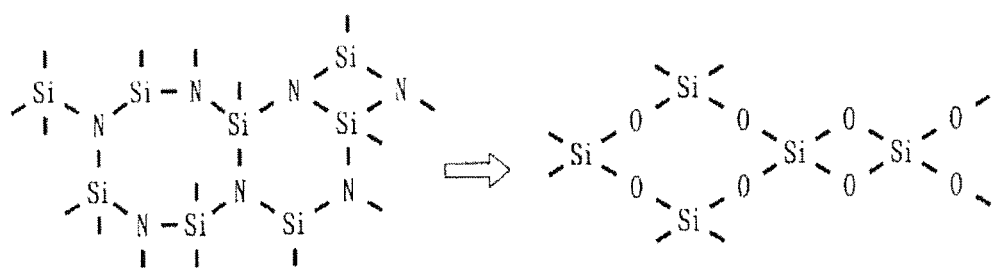
FIG. 8 is a schematic diagram showing the conversion of Si—N to Si—O bond.

Referring FIGS. 5 and 6, Step S18: effecting a heating process. Please refer to FIG. 7 in conjunction. Step S18 includes the conversion of the hydrophilic thin film 40 having oxygen ions 41 and the SOD materials 50 to a silicon oxide layer 60. Specifically, the heating process includes baking/curing, wet oxidation, dry oxidation and high temperature annealing. In this way, the organic solvent is removed from the liquid SOD materials 50 and the Si—N bond is converted to Si—O bond to form silicon dioxide, as shown in FIG. 8.

Moreover, in the curing process, the hydrophilic thin film 40 may provide additional oxygen to facilitate SOD materials 50 to convert to silicon dioxide. That is to say the hydrophilic thin film 40 having oxygen ions 41 may serve as a source of oxygen in the formation of the silicon oxide layer 60. The overall period of curing process may be shortened as well. In addition, the oxygen ions 41 enhance the consistency or hardness of the silicon dioxide layer after converted from the SOD materials 50. As a result, erosion in the silicon oxide layer 60 is prevented in the subsequent hydrofluoric acid washing.

In conclusion, compared to conventional method of manufacturing isolation structure, the instant disclosure provides a hydrophilic thin film having oxygen ions. The hydrophilic film reduces the surface tension of the inner wall of the trenches. Therefore the SOD materials may easily flow into the trenches in the SOD processing to avoid void formation. Furthermore, in the heat processing, the hydrophilic thin film provides additional oxygen for converting the SOD materials into silicon dioxide. The curing process time is shortened in this way. Additionally, the oxygen ions enhance the surface consistency and hardness of silicon dioxide after converted from the SOD materials. The erosion in the silicon oxide layer is prevented in the subsequent hydrofluoric acid washing.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. A method of manufacturing an isolation structure comprising:
   forming a laminate structure on a substrate;
   forming a plurality of trenches in the laminate structure;
   performing a pretreatment process to form a hydrophilic thin film having oxygen ions on the inner wall of the trenches, wherein the pretreatment process is conducted at about 470° C. to 490° C. for approximately 30 to 50 seconds;
   filling spin-on-dielectric (SOD) materials into the trenches, wherein the hydrophilic thin film having oxygen ions is formed to change the surface tension of the inner wall of the trenches to increases the fluidity of the SOD materials; and
   performing a curing process that converts the hydrophilic thin film having oxygen ions and the SOD materials into a silicon oxide layer, wherein the hydrophilic thin film provides oxygen ions in the conversion.

2. The method of manufacturing an isolation structure according to claim 1, wherein the curing process further comprises curing, wet oxidation, dry oxidation and high temperature annealing for converting the Si—N bond to Si—O bond in the SOD materials.

3. The method of manufacturing an isolation structure according to claim 1, wherein the SOD material is a polysilazane solvent or a perhydro-silazane solvent.

4. The method of manufacturing an isolation structure according to claim 1, wherein the pretreatment process produces oxygen ions by high radio frequency (RF) power, ultra violet, heating or plasma and the oxygen ions attach to the inner wall of the trenches to form the hydrophilic thin film.

5. The method of manufacturing an isolation structure according to claim 1, wherein the pre-processing is conducted in vacuum, subatmosphere, atmosphere, or pressured condition.

6. The method of manufacturing an isolation structure according to claim 1, wherein the laminate structure includes an oxide layer, a silicon rich layer formed on the oxide layer, a tungsten layer formed on the silicon rich layer and a silicon nitride layer formed on the tungsten layer.

7. The method of manufacturing an isolation structure according to claim 1, wherein forming the plurality of trenches in the laminate structure further comprises:
- forming a silicon oxide pad layer on the laminate structure and a silicon nitride hard cover of the silicon oxide pad layer thereon;
- patterning the hard cover and the pad layer; and
- etching the laminate structure by using the patterned hard cover and pad layer as a mask to form the trenches.

8. The method of manufacturing an isolation structure according to claim 1, wherein forming the plurality of trenches in the laminate structure further comprises:
- forming a patterned photoresistance layer on the laminate structure; and
- etching the laminate structure by using the patterned photoresistance layer as a mask to form the trenches.

* * * * *